(12) United States Patent
Bailey et al.

(10) Patent No.: US 6,624,663 B2
(45) Date of Patent: Sep. 23, 2003

(54) LOW THRESHOLD VOLTAGE SILICON-ON-INSULATOR CLOCK GATES

(75) Inventors: Daniel William Bailey, Northboro, MA (US); Daniel E. Dever, Spencer, MA (US); Ronald P. Preston, Malborough, MA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 11 days.

(21) Appl. No.: 10/000,258

(22) Filed: Oct. 31, 2001

(65) Prior Publication Data

US 2003/0080782 A1 May 1, 2003

(51) Int. Cl.[7] ..................... H03K 3/01; H03K 19/096
(52) U.S. Cl. ..................... 326/93; 326/98; 327/534
(58) Field of Search ..................... 326/33, 34, 83, 326/86, 95, 98, 119, 121; 327/299, 534

(56) References Cited

U.S. PATENT DOCUMENTS 6,404,243 B1 * 6/2002 Koch, II et al. ............ 327/107
6,469,568 B2 * 10/2002 Toyoyama et al. .......... 327/534

* cited by examiner

Primary Examiner—Daniel Chang

(57) ABSTRACT

A clock driver is disclosed that minimizes propagation delay, and thus improves the integrity of a clock distribution network. The clock driver preferably is implemented with silicon-on-insulator (SOI) technology, and comprises an inverter with an nFET and pFET that are body-connected. The body connection serves to reduce the body voltage of the pFET, while increasing the body voltage of the nFET. This shifting of the voltage reduces the voltage threshold differential for both the nFET and pFET, which translates into a design that experiences less propagation delay due to voltage variations and fluctuations. If desired, the body voltages may be slightly offset from each other by placing one or more voltage drop transistors in the conductive path between the bodies of the nFET and pFET. In addition, the present invention may be used to design a programmable inverter that can operate in a low power mode, or in a high precision mode.

47 Claims, 5 Drawing Sheets

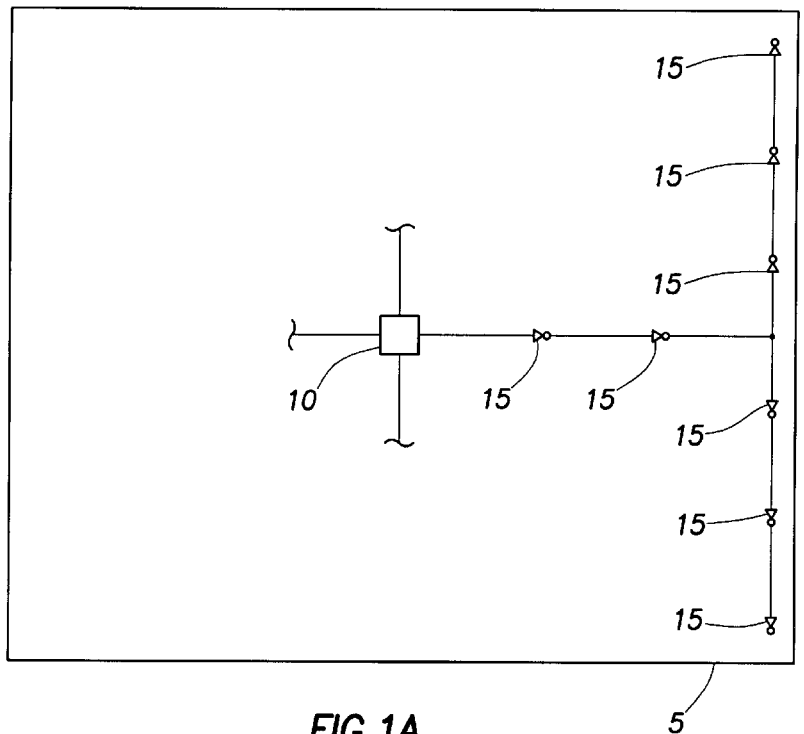
FIG. 1A
(PRIOR ART)
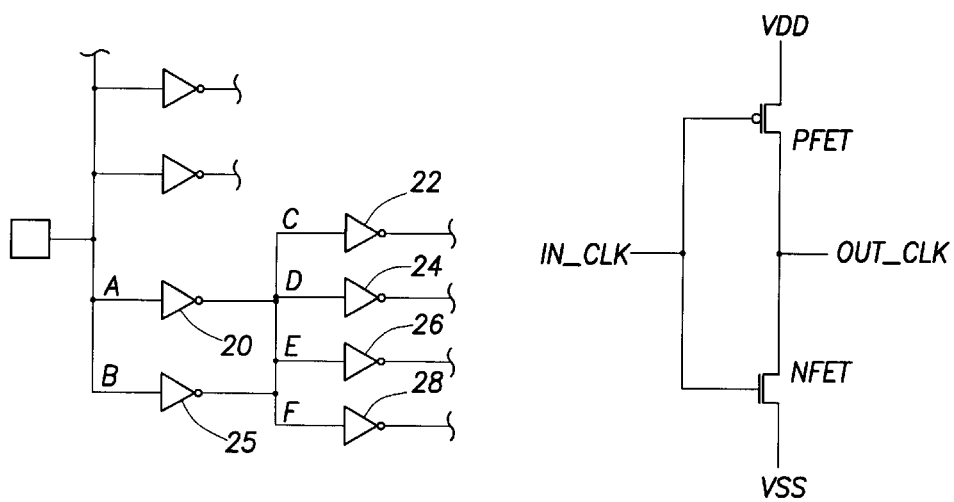
FIG. 1B
(PRIOR ART)
FIG. 2A
(PRIOR ART)

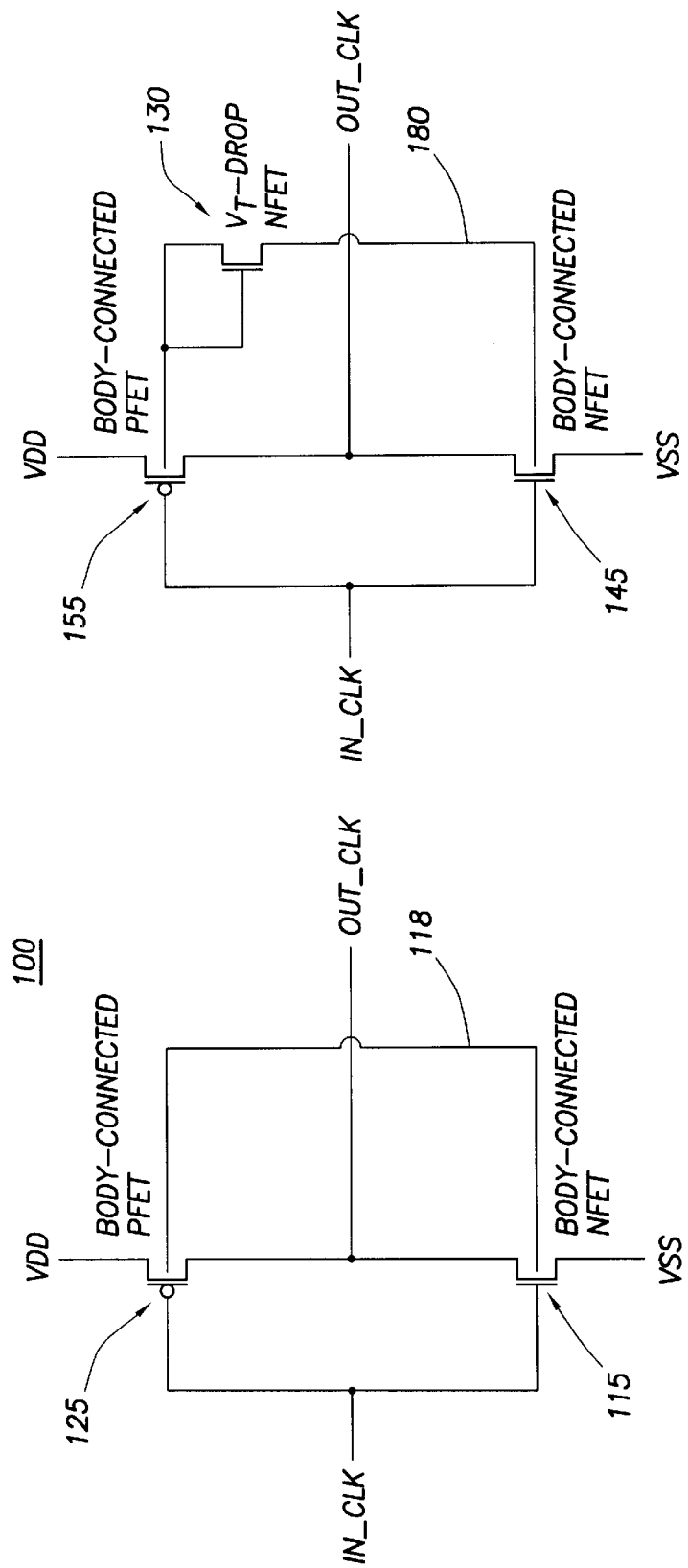

LOW THRESHOLD VOLTAGE SILICON-ON-INSULATOR CLOCK GATES

CROSS-REFERENCE TO RELATED APPLICATIONS

Not applicable.

STATEMENT REGARDING FEDERALLY SPONSORED RESEARCH OR DEVELOPMENT

Not applicable.

BACKGROUND OF THE INVENTION

1. Field of the Invention

The present invention generally relates to clock generation in an integrated circuit. More particularly, the present invention relates to the minimization of clock skew and jitter in a clock distribution network. Still more particularly, the present invention relates to a clock distribution network design in which clock drivers are designed using silicon-on-insulator techniques to render the drivers relatively insensitive to power supply variations and fluctuations to thereby reduce the effects of skew and jitter in the distributed clock signals.

2. Background of the Invention

One of the critical design elements in modern processor chips and other very large scale integrated circuits is the manner in which the clock signals are distributed within the integrated circuit. Most digital circuits require a clock signal to operate, and data in a digital circuit typically is latched, processed, and output on one or more edges (i.e., the rising edge, the falling edge, or both) of the clock signal. Thus, without a good quality clock signal, most digital circuits will not operate properly, or will operate erratically.

In modem processor designs, and other very large scale integrated circuits, the clock signal may need to be distributed to relatively large areas of the die, because of the layout of the digital circuitry. To enable the clock signal to be effectively transmitted over long distances, it is common to use clock drivers that are distributed throughout the die. Without the clock drivers, the clock signal may attenuate or degrade to such an extent that the receiving digital circuitry cannot operate properly. This problem is compounded as designers reduce the power supply voltage. Thus, more than ever, clock drivers are required to insure that a high quality clock signal is delivered to the digital circuitry in the integrated circuit.

As even the most casual observer is aware, the clock speed of modem digital circuitry has increased at an astonishing rate. It has become commonplace for processors to meet or exceed clock speeds of 1 Gigahertz. Clock speeds have become sufficiently high that the problem of delivering a high quality clock signal to all digital circuits in a large integrated circuit, such as a processor, is becoming increasingly challenging. A processor with a 1GHz clock means that 1 billion clock pulses must be transmitted to each digital circuit device on the die each second. Moreover, to avoid problems with clock skew and jitter, a relatively stable clock signal must arrive at the digital circuits at substantially the same time. If the clock signals do not arrive at each digital circuit at virtually the same time, drastic consequences may result, which could cause the processor to operate improperly or to fail. As an example, most processors include a processor core and an on-chip cache memory. According to normal convention, the processor core saves and retrieves data to the cache memory during normal processor operations. The protocol by which data is read from and written to the cache is precisely set to maximize system efficiency. During a read cycle, for example, the processor core expects that data from the cache will be made available on a predetermined number of clock cycles after the read request. If the cache memory receives the clock signal at a point in time that is delayed relative to the processor core, the cache memory may not have the data available when expected. The processor core may nonetheless interpret the state of the signal lines as the read data, and thus may accept invalid data. Such a result could be catastrophic.

To avoid these and other errors that result from clock skew and clock jitter, clock distribution networks are implemented to ensure some acceptable level of synchronism between the digital circuitry. Typically, a clock distribution tree is provided in the integrated circuit to distribute the clock signal throughout the die. As shown in FIG. 1A, the clock distribution tree distributes one or more clock signals from a common clock generator 10, which is specially placed on the die 5. An example of a portion of one branch of a clock distribution tree is shown in FIG. 1A, for purposes of illustration. As shown in FIG. 1A, a plurality of clock repeaters (or clock drivers) 15 are provided in each branch to regenerate and re-transmit the clock signal to the digital circuitry on the die to ensure that each digital circuit receives high quality clock signals. Five clock drivers are shown in each of the two branches depicted in FIG. 1A, providing clock signals to the upper right die region and the lower right die region. Each clock driver defines another "stage" of the clock distribution tree, and each clock distribution stage produces a limited amount of gain to the clock signal. The number of clock distribution stages is dictated by the area covered on the die, and the load (i.e., the number of devices that receive the clock signal on each branch). Each stage of the clock distribution network introduces a risk that a variation will be produced that will result in the clock signals not being synchronized between different distribution branches. To minimize this risk, equidistant signal paths or traces generally are used to connect each of the digital circuits to the clock generator 10. By using signal paths of equal length, the propagation delay is minimized. To further minimize the risk that different distribution branches may have a different propagation delay, each clock driver 15 is identically constructed, and drivers are located uniformly in the branches.

According to conventional techniques, the clock drivers 15 are implemented using inverters, which comprise a relatively simple circuit design. An example of a standard clock inverter used in digital circuit design is shown in FIG. 2A. As shown in FIG. 2A, the conventional inverter comprises a pFET (p-junction field effect transistor) and an nFET (n-junction field effect transistor) with their gates tied to a common clock input terminal and their drains tied to a common clock output terminal. The Source terminal of the pFET connects to the voltage power supply $V_{DD}$, while the Source of the nFET connects to $V_{SS}$. When a low voltage (a binary "0") appears at the clock input terminal, the nFET is non-conducting, while the pFET conducts the voltage power supply $V_{DD}$ at the Source terminal to the Drain terminal, which produces a high voltage (a binary "1") at the clock output terminal. Conversely, when the input clock terminal is at a high voltage (a binary "1"), the pFET is non-conducting, and the nFET conducts, causing the low voltage $V_{SS}$ (a binary "0") to appear at the clock output terminal.

Despite the precautions taken in designing clock distribution networks, propagation delays still occur among different clock paths. These propagation delays result from several factors. One of the primary factors that cause this propagation delay is local variation in the power supply voltage. These variations in power supply voltage occur due to the load experienced within a particular region. Thus, the region of the CPU core may be drawing more power than another area, such as the cache memory. This may cause the CPU core region, for example, to experience a reduction in the power supply voltage by a significant amount (which could differ by as much as 15–25% across different die regions). Generally, the higher the power supply voltage, the faster the signal will propagate through the clock driver (or inverter). Thus, these voltage fluctuations produce non-uniform propagation delays that result from heavier circuit operation in a particular region of the die. Other factors, which also can cause propagation delays, are temperature gradients, process variations, and the like.

Some attempts have been made to mitigate the propagation delay caused by these environmental and process factors. One technique that has been used is to tie together the inputs and outputs of some of the clock drivers, so that one or more stage of clock drivers is driven by two different clock paths, as shown for example in FIG. 1B. As FIG. 1B illustrates, clock drivers 22, 24, 26, 28 are driven both by clock driver 20 and 25 (which may be designed to produce 50% of the gain of a conventional single clock driver). Branches A and B therefore both provide a clock input signal to branches C, D, E and F. In this design, the clock drivers 22, 24, 26, 28 that are driven by multiple drivers will experience a propagation delay which is some proportional average of the propagation delay experienced on branch A and branch B, thus minimizing skew effects. Thus, for example, if branch A has less of a propagation delay than branch B, the clock signal from branch A will arrive at each of the inverters 22, 24, 26, 28, and begin charging these clock drivers. When the clock signal arrives from branch B, this charging process is accelerated, and eventually each of the inverters 22, 24, 26, 28 generate an output signal. The result is that each of branches C, D, E, and F have a propagation delay that is some proportional average of the propagation delay of branches A and B.

While the approach depicted in FIG. 1B has some effectiveness in compensating for voltage gradients, it also has some serious limitations. One limitation is that the averaging technique only is effective in minimizing the propagation delay variations between branches that can be tied together. If branches in other regions of the die are not tied to common clock drivers, then the different branches will still experience clock skew. Thus, the technique of FIG. 1B works best if the clock drivers are relatively close together, so that the inputs and outputs of the drivers can be connected together. In addition, while this approach reduces skew between different locations in the die, it does not reduce clock jitter, which relates to non-uniformity or instability of the phase and/or amplitude of the clock signal. Clock jitter may be caused by several factors, including temperature fluctuations within a particular region or zone on the die. These temperature fluctuations can cause the phase and/or amplitude of the clock signal to vary even within the same branch. Variances in phase and amplitude can affect the ability of the digital circuitry to perform necessary processes within a prescribed number of clock cycles. The approach illustrated in FIG. 1B, therefore, does not address clocking errors introduced by clock jitter, but instead focuses on averaging the time delays (or skew) on different clock branches.

As processors and other circuit designs become increasingly fast, it becomes desirable to design a clock driver that is relatively immune to the effects of voltage variations and fluctuations in the die to minimize both clock skew and jitter. Thus, it would be advantageous if a clock driver were developed that exhibited a more uniform operation in the face of power supply voltage fluctuations. Despite these apparent advantages, to date no one has developed a clocking distribution network that solves the problem of both clock skew and clock jitter.

BRIEF SUMMARY OF THE INVENTION

The present invention solves the deficiencies of the prior art by implementing a clock driver using silicon-on-insulator technology, and tying together the bodies of the nFET and pFET gates. By tying together the nFET and pFET bodies of the clock driver, the voltage of the nFET body is raised and the voltage of the pFET body is lowered. The net result is that the threshold voltage for both the nFET and pFET is decreased, thereby minimizing the propagation delay of each clock driver attributable to power supply voltage fluctuations and variations.

Silicon-on-insulator technology provides a vehicle to modify the threshold voltage of the nFET and pFET gates in the clock driver. Because the pFET body voltage is relatively high, while the nFET body voltage is relatively low, electrically coupling the nFET and pFET bodies produces an intermediate body voltage for both nFET and pFET gates. The body voltage of the FET relates to the threshold voltage of the gate. Increasing the body voltage of the nFET decreases the threshold voltage level of the nFET, thereby making it a faster device that experiences less propagation delay. Conversely, decreasing the body voltage of the pFET increases the threshold voltage level, thereby minimizing the voltage differential between the power supply voltage, $V_{DD}$, and the pFET threshold voltage. By minimizing this voltage differential, the pFET becomes a faster device, and also experiences less propagation delay.

According to another embodiment of the present invention, the bodies of an nFET and a pFET in an inverter are electrically coupled, thereby lowering the body voltage of the pFET, while raising the body voltage of the nFET to a common voltage level. By raising the body voltage of the nFET, the threshold voltage of the nFET is reduced, thus minimizing the propagation delay in the nFET. Similarly, lowering the body voltage of the pFET causes the threshold voltage of the pFET to rise, thereby minimizing the voltage differential between $V_{DD}$ and the threshold voltage. Minimizing the threshold voltage differential of the pFET minimizes the propagation delay in the nFET. The net effect is a reduction in propagation delay of the inverter.

In another embodiment, the body of an nFET may be coupled to the body of a pFET through one or more voltage drop transistors. The voltage drop transistor(s) may be either nFETs or pFETs. The use of the voltage drop transistor(s) serves to displace the body voltage of the primary nFET and pFET, thereby reducing leakage through these transistors, while at the same time lowering the body voltage of the pFET, and raising the body voltage of the nFET.

The present invention may also be used to make a programmable clock driver, which can be selected to operate at a high speed with a reduction in propagation delay. Alternatively, the programmable clock driver may be selected to operate at a lower speed, with less leakage through the inverter gates, thereby reducing power consumption. To operate at high speed, with an attendant reduction in propagation delay, the circuit is configured to connect the body of the inverting pFET and nFET together to tie the body voltages of these two gates to each other.

To operate with a reduction in power, the pFET body may be connected to the power supply voltage, thus increasing the pFET body voltage. This in turn causes the threshold voltage differential for the pFET gate to increase, which reduces leakage through the pFET gate. Similarly, the nFET body may be connected to $V_{SS}$, thereby dropping the body voltage of the nFET. This reduction in the body voltage causes the threshold voltage of the nFET to increase, which reduces leakage through the nFET. The benefit of this gate is that it can operate with less power than a conventional gate. Thus, the present invention may also be used to increase the threshold voltage differential, to minimize leakage current in low-power devices, such as notebook computers and personal device assistants (PDAs).

These and other aspects of the present invention will become apparent upon analyzing the drawings, detailed description and claims, which follow.

BRIEF DESCRIPTION OF THE DRAWINGS

For a detailed description of the preferred embodiments of the invention, reference will now be made to the accompanying drawings in which:

FIG. 1A is a partial illustration of a conventional clock distribution tree used to distribute clock signals throughout an integrated circuit;

FIG. 1B is a block diagram of a prior art clock distribution network that connects together the input terminals of same stage clock inverters to minimize clock skew;

FIG. 2A is a block diagram of a prior art clock driver implemented as an inverter;

FIG. 5 is a schematic illustration of a clock driver configured in accordance with the preferred embodiment with an nFET body coupled to a pFET;

FIG. 6 is an alternative embodiment of a clock driver in which a voltage drop nFET is placed in the conductive path of FIG. 5;

NOTATION AND NOMENCLATURE

Certain terms are used throughout the following description and claims to refer to particular system components. As one skilled in the art will appreciate, computer companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . .". Also, the term "couple" or "couples" is intended to mean either an indirect or direct electrical connection. Thus, if a first device couples to a second device, that connection may be through a direct electrical connection, or through an indirect electrical connection via other devices and connections. To the extent that any term is not specially defined in this specification, the intent is that the term is to be given its plain and ordinary meaning.

DETAILED DESCRIPTION OF THE PREFERRED EMBODIMENTS

The present invention includes a new circuit design for a clock driver that minimizes propagation delay resulting from voltage variations and fluctuations. The present invention also discloses a programmable clock driver that can be optimized to operate either with a minimum propagation delay or with minimal power consumption.

As will be understood by one skilled in the art, a logic circuit, such as an inverter, has a threshold voltage at which it will change state. The threshold voltage for a logic circuit also is sometimes referred to as the "turn-on" voltage. The threshold voltage is the voltage level required at the input terminal before the logic circuit recognizes a signal as changing state. When the voltage at the input terminal exceeds the threshold voltage, the logic circuit interprets the input signal to be a "1". Conversely, if the voltage at the input terminal is below a minimum threshold level, the logic circuit interprets the input signal as a "0".

Figure 2B:
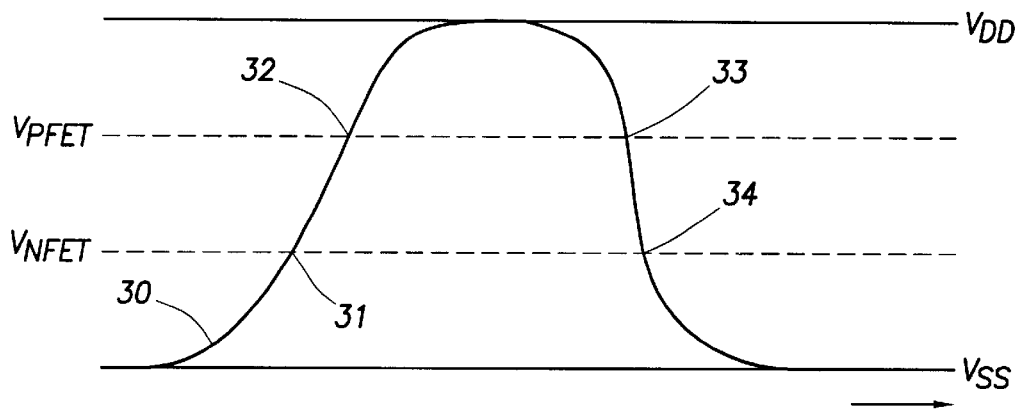
FIG. 2B depicts the threshold voltage levels at which the inverter of FIG. 2A recognizes an input signal as changing states.

In FIG. 2B, one-half cycle of an input clock signal is shown for purposes of illustrating the manner in which a voltage threshold is relevant to a clock driver. For purposes of discussion, assume the input clock signal of FIG. 2B is provided to the conventional inverter of FIG. 2A. Initially, the input clock signal is shown to be at a binary "0" at time 30. According to normal convention, the input clock signal cycles from a lower voltage, (commonly denoted as $V_{SS}$) to an upper voltage ($V_{DD}$), and then back to the lower voltage.

Each of the nFET and pFET gates in FIG. 2A have their own voltage threshold value. Thus, the nFET switches on and off based on a threshold value ($V_{nFET}$) above $V_{SS}$, while the pFET switches on and off based on a threshold value ($V_{pFET}$) at some voltage below $V_{DD}$. In FIG. 2B, as the voltage signal rises above the lower voltage level ($V_{SS}$), the voltage level exceeds the threshold value for the nFET, as shown at point 31. This threshold value is labeled as $V_{nFET}$ in FIG. 2B. At this point, the nFET turns on, and causes a low voltage ($V_{SS}$) to appear on the drain terminal of the nFET. As the clock input voltage level exceeds the pFET threshold value at point 32, the pFET turns off. Stated differently, as the input voltage increases to point 32, the voltage falls below the threshold voltage differential (in absolute terms relative to $V_{DD}$) for the pFET, thereby causing the pFET to turn off. The pFET threshold voltage is shown in FIG. 2B as $V_{pFET}$. This combination of turning on the nFET and turning off the pFET causes a "0" to appear on the output of the inverter as the input clock signal transitions from a low voltage to a high voltage. As the voltage of the clock signal input decreases from $V_{DD}$ to $V_{SS}$, the pFET turns back on at point 33, while the nFET turns off at point 34, thus causing the output of the inverter to transition from a "0" to a "1". While the above discussion shows the threshold voltage for the pFET ($V_{pFET}$) as having a higher voltage level than the threshold voltage of the nFET ($V_{nFET}$), it also possible for the reverse to occur—that is, that the threshold voltage for the nFET ($V_{nFET}$) may have a higher voltage level than the threshold value for the pFET ($V_{pFET}$). In that case, the pFET would turn off before the nFET turns on, and the nFET would turn off before the pFET turns on.

The threshold voltage of the nFET and pFET thus controls many of the electrical performance properties of the inverter, including among other things, the speed of the inverter. As one aspect of the present invention, the inventors have discovered that there is less delay propagation of the clock drivers due to voltage fluctuations if the threshold voltage is lowered for the nFET and pFET gates in the inverter. Thus, for clock gates, there is less sensitivity to power supply fluctuations if the threshold voltage differentials are lowered. The correlation between delay sensitivity and power supply threshold voltage can be established mathematically, as follows.

In a logic gate such as an inverter, the charge (Q) is equal to the capacitance (C) of the inverter, multiplied by the voltage differential (V) across the capacitance layers, as shown in equation (1):

$$CV = Q \quad (1)$$

The current through the drain ($I_D$) is equal to the change in charge that occurs over a particular time period:

$$I_D = \frac{dQ}{dt} \quad (2)$$

Combining equations (1) and (2) establishes that the propagation delay $t_{prop}$ of the inverter can be approximated as $$t_{prop} \propto \frac{V_{DD} * C_{load}}{I_D} \quad (3)$$

where $C_{load}$ represents the capacitance of the load and $V_{DD}$ is the power supply voltage. If it is assumed that the input clock signal has a very fast rise time relative to the propagation delay time $t_{prop}$ (i.e., the clock signal resembles a square wave), then the driving FET will be in saturation, and the gate-to-source voltage ($V_{GS}$) will equal the power supply voltage. In that event, the current through the drain ($I_D$) is in saturation, and can be qualified as $$I_D = I_{Dsat} = \frac{\beta}{2}(V_{GS} - V_T)^2 \quad (4)$$

where $V_T$ represents the threshold voltage, and $\beta$ is a proportionality constant based on the characteristics of the transistor. Substituting the formula $I_D$ in equation (4) for the value $I_D$ in equation (3) yields:

$$t_{prop} \propto \frac{K * V_{DD}}{(V_{GS} - V_T)^2} = \frac{K * V_{DD}}{(V_{DD} - V_T)^2} \quad (5)$$

where the term K represents a proportionality constant. The rate at which the propagation delay varies with the power supply variation is represented by:

$$\frac{dt_{prop}}{dV_{DD}} = \frac{d}{dV_{DD}} \frac{KV_{DD}}{(V_{DD} - V_T)^2} = \frac{-K(V_{DD} + V_T)}{(V_{DD} - V_T)^3} \quad (6)$$

Equation (6) establishes that as the threshold voltage, $V_T$, becomes smaller, so too does the change in propagation delay of the inverter, $t_{prop}$, with change in the power supply voltage, $V_{DD}$. Thus, according to the preferred embodiment, the present invention proposes a clock driver design that implements a relatively low threshold voltage for the transistor gates to minimize propagation delay through the clock driver. In real terms, this means that the drain current ($I_D$) will change less as a percentage of $V_{DD}$.

Figure 3:
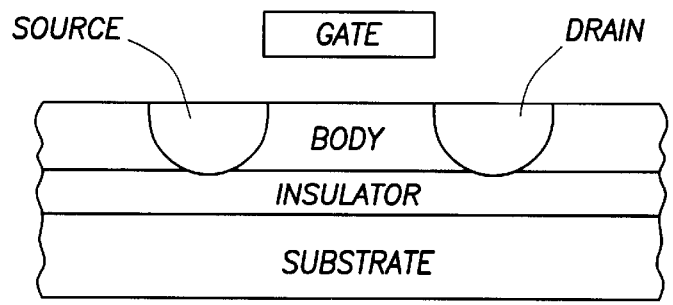
FIG. 3 is an illustration of a conventional silicon-on-insulator FET configuration.

According to the preferred embodiment, the present invention is implemented using silicon-on-insulator (SOI) technology. SOI technology is a fabrication technology currently being implemented by many semiconductor foundries. SOI technology is recognized as a faster technology, with lower power consumption, and which produces a smaller capacitance in the transistors. One particular advantage of SOI technology applicable to the present invention is that SOI fabrication permits a transistor to be designed with a variable threshold voltage by changing the body design. For an nFET, the larger the body voltage, the lower the voltage threshold. A conventional SOI transistor is shown in FIG. 3, which depicts a cross-section of a field effect transistor (FET) for purposes of discussion. According to normal convention, the FET includes a Source, a Drain and a Gate. When the appropriate threshold voltage appears on the Gate, current is conducted between the Source and Drain along the upper region of the body between the Source and Drain. In SOI technology, an insulator layer is placed beneath the body and the Source and Drain. Below the insulator is the silicon substrate.

In typical SOI implementations, the voltage of the body floats (in other words, the body of an nFET is not connected to ground, and the body of a pFET is not connected to $V_{DD}$). The voltage of the body dictates, in part, the threshold voltage for the FET. The higher the body voltage, the lower the threshold voltage for an nFET. Similarly, the lower the body voltage (the further away the voltage is from $V_{DD}$), the lower the threshold voltage for a pFET (the closer the threshold voltage is to $V_{DD}$). To minimize the voltage threshold of the nFET and pFET in the inverter, the conventional SOI transistor gates preferably are modified according to the preferred embodiment to tie the body of the nFET to the body of the pFET. Thus, as shown in the conceptual illustration of FIG. 4, an nFET 45 and pFET 55 are manufactured on a single piece of silicon 60 (referred to as a substrate), with an insulating layer 65 positioned above the substrate. The nFET 45 includes a Gate, Source and Drain in accordance with normal convention. The body 70 of nFET 45 preferably lies between the Source and Drain in accordance with normal convention. Similarly, pFET 55 includes a Gate, Source and Drain (which may be shared with nFET 45) in accordance with normal convention, with a body region 75 positioned generally between the Source and Drain.

Figure 4:
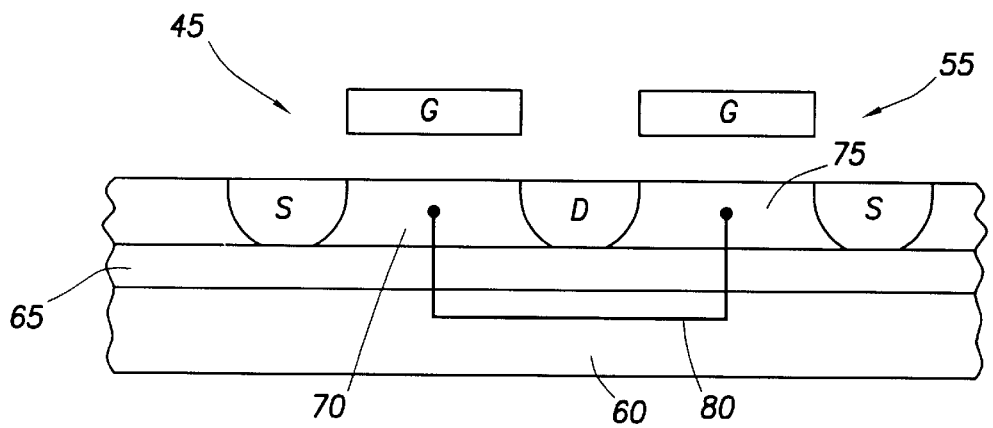
FIG. 4 is an exemplary illustration of an SOI inverter configuration with the body of the nFET and the body of the pFET connected.

In accordance with the preferred embodiment, the body 70 of nFET 45 electrically connects to the body 75 of pFET 55 via a conductive path 80 or other coupling mechanism, instead of permitting the voltage of the bodies to float. This connection of the bodies causes the voltage of the nFET body to rise, while causing the voltage of the pFET body to lower. The net effect is that the voltage threshold is reduced in absolute terms for both the nFET and the pFET. One skilled in the art will understand that FIG. 4 is a conceptual illustration of the body connection between the nFET 45 and pFET 55. It should be understood that the actual topology of the design may differ significantly from that shown, and there is no intention that the conductive path 80 be positioned in any particular orientation or layer of the semiconductor device.

Referring now to FIG. 5, the body-connected nFET and pFET inverter design is shown schematically. The inverter 100 of FIG. 5 thus is constructed similarly to the prior art inverter of FIG. 2, except that the body of the nFET 115 and pFET 125 are electrically connected by conductive path 118, preferably using SOI technology. This electrical connection 118 causes the nFET body voltage, which normally is relatively low, to increase, thereby decreasing the threshold voltage of the nFET. Similarly, the electrical body connection 118 causes the pFET body voltage, which normally is relatively high, to decrease, thereby also decreasing the threshold voltage (in absolute terms) of the pFET. As a result, and as demonstrated by Equations (1)–(6), this decrease in threshold voltage renders the inverter 100 less subject to propagation delay as the power supply voltage fluctuates. Simulations of the embodiment of FIG. 5 have shown that the voltage threshold for the nFET 115 and pFET 125 can be reduced from approximately 400 millivolts to 100 millivolts by using the body connection.

Various embodiments of the present invention are possible, as will be apparent to one skilled in the art. A few such embodiments are shown in FIGS. 6–9 and will be briefly described with the understanding that these embodiments are merely examples of how the present invention can be implemented in circuit designs. As shown in FIG. 6, in one alternative embodiment, a transistor 130 can be placed in the conductive path 180 between the nFET body and the pFET body. In FIG. 6 this transistor 130 is referred to as a voltage-drop (or $V_T$-drop) nFET, indicating that the transistor 130 is an nFET. The Source and Gate of the $V_T$-drop nFET 130 connect to the body of the pFET 155, while the Drain of the $V_T$-drop nFET 130 connects to the body of nFET 145. The $V_T$-drop nFET 130 of FIG. 6 is almost always on, and produces a threshold drop across the Source and Drain terminals of transistor 130. Thus, the $V_T$-drop nFET in FIG. 6 permits the pFET body voltage to be separated from the nFET body voltage by an amount equal to the voltage differential in the $V_T$-drop nFET (as measured across the Source and Drain terminals of the $V_T$-drop nFET ). While the inclusion of the $V_T$-drop nFET 130 in the body connection 180 slightly raises the threshold voltage differentials of the nFET 145 and pFET 155 (in absolute terms), it reduces the amount of leakage that would otherwise occur through these gates. Thus, the embodiment of FIG. 6 may be used during implementation to insure that the inverter does not suffer from excessive leakage.

Figure 7:
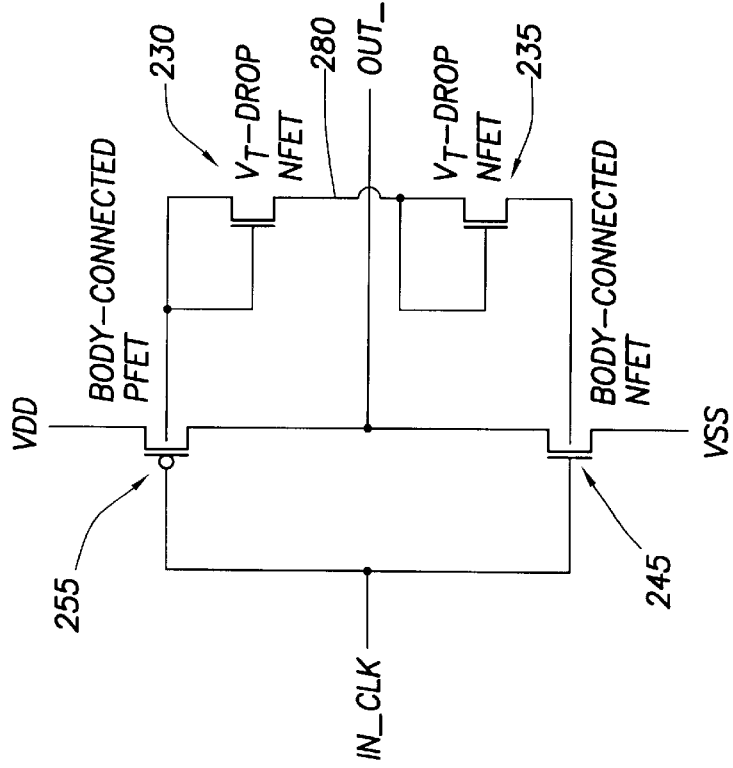
FIG. 7 is another alternative embodiment of a clock driver in which two voltage drop nFETs are placed in the conductive path of FIG. 5.

The same concept shown in FIG. 6 may be extended as shown for example in FIG. 7. In FIG. 7, an nFET 245 and a pFET 255 are configured in an inverting arrangement. The bodies of the nFET 245 and pFET 255 electrically connect via a conductive path 280. According to this embodiment, two nFET gates 230, 235 are provided in the conductive path 280. The Source and Gate of the $V_T$-drop nFET 230 connect to the body of the pFET 255, while the Drain of the $V_T$-drop nFET 230 connects to the Source and Gate of the second $V_T$-drop nFET 235. The Drain of the second $V_T$-drop nFET 235 connects electrically to the body of nFET 245. By placing two $V_T$-drop nFETs in series, the voltage differential between the body of the pFET 255 and the body of the nFET 245 is doubled, as compared to the embodiment of FIG. 6.

Figure 8:
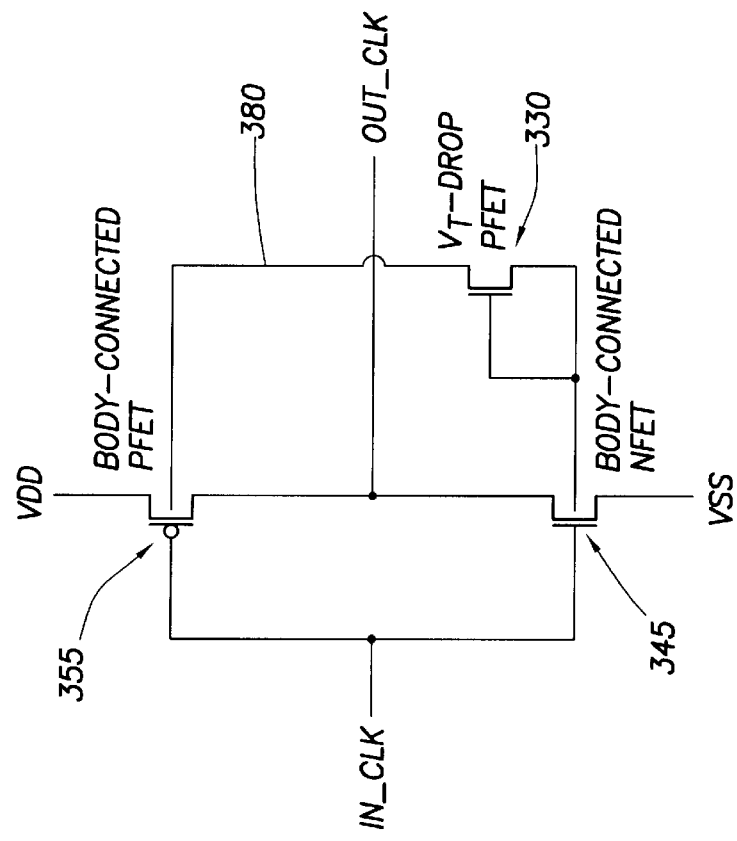
FIG. 8 is an alternative embodiment of a clock driver in which a voltage drop pFET is placed in the conductive path of FIG. 5.

Referring now to FIG. 8, in another alternative embodiment, a voltage drop ($V_T$-drop) pFET 330 may be placed in the conductive path 380 between the nFET body and the pFET body. The Source and Gate of the $V_T$-drop pFET 330 connect to the body of the nFET 345, while the Drain of the $V_T$-drop pFET 330 connects to the body of pFET 355. The $V_T$-drop pFET 330 of FIG. 8 is almost always on, and produces a voltage drop across the Source and Drain terminals of FET 330. Thus, the $V_T$-drop pFET in FIG. 8 permits the pFET body voltage to be separated from the nFET body voltage by an amount equal to the voltage differential in the $V_T$-drop pFET (as measured across the Source and Drain terminals of the $V_T$-drop pFET).

Figure 9:
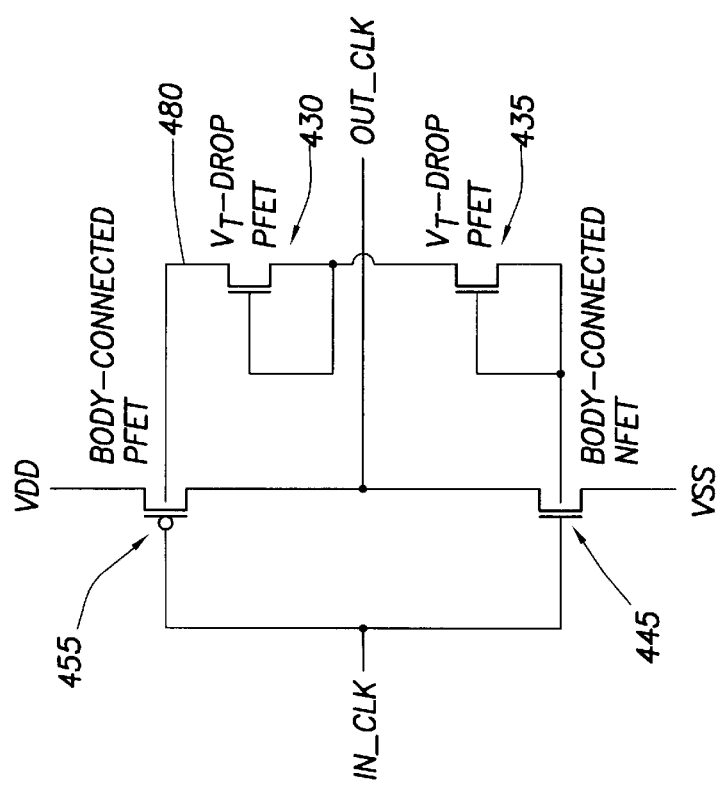
FIG. 9 is another alternative embodiment of a clock driver in which two voltage drop pFETs are placed in the conductive path of FIG. 5.

In the alternative embodiment of FIG. 9, an nFET 445 and a pFET 455 are configured in an inverting arrangement. The bodies of the nFET 445 and pFET 455 electrically connect via a conductive path 480. According to this embodiment, two pFET gates 430, 435 are provided in the conductive path 480. The Source and Gate of the $V_T$-drop pFET 435 connect to the body of the nFET 445, while the Drain of the $V_T$-drop pFET 435 connects to the Source and Gate of the second $V_T$-drop pFET 430. The Drain of the second $V_T$-drop pFET 430 connects electrically to the body of pFET 455. By placing two $V_T$-drop pFETs in series, the voltage differential between the body of the pFET 455 and the body of the nFET 445 is doubled, as compared to the embodiment of FIG. 8.

Figure 10:
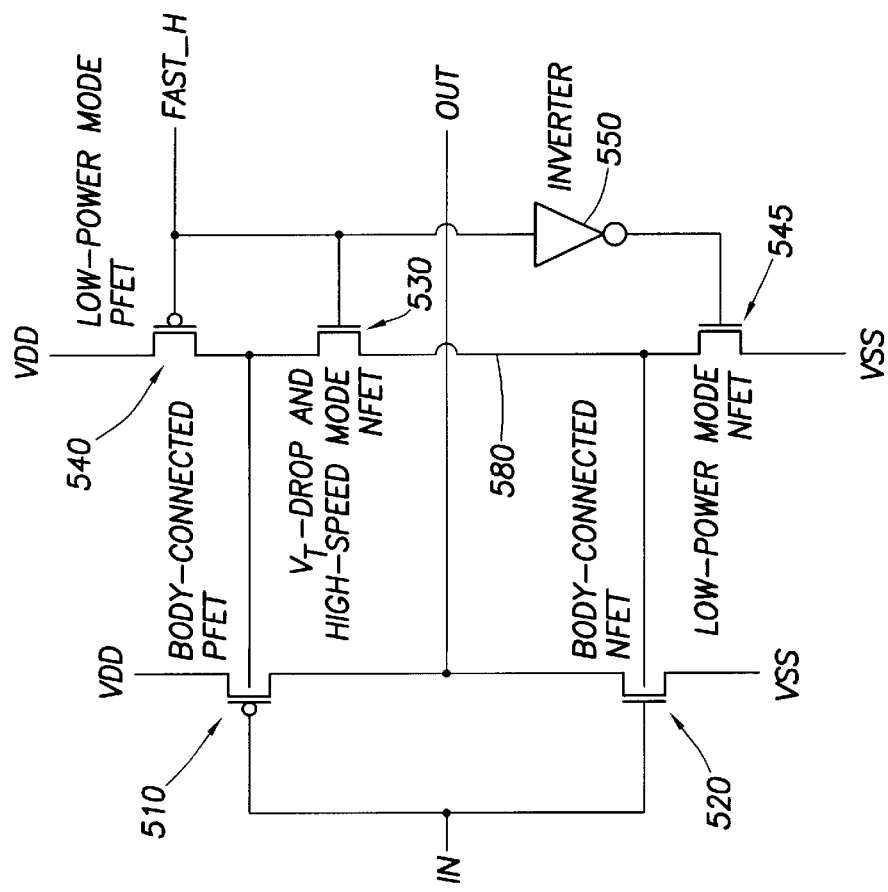
FIG. 10 illustrates a programmable inverter design, in accordance with the principles of the present invention.

In accordance with another aspect of the present invention, the principles of the present invention may also be applied to reduce leakage through the clock driver or other inverter, thus making it consume less power. Such an inverter has application in any battery-powered device, or any other device in which it is desirable to reduce power consumption. Referring now to FIG. 10, the techniques disclosed above may be used to raise the threshold voltage levels by raising the body voltage of a pFET in an inverter, while lowering the body voltage of an nFET in the inverter. While such a technique would slow down the speed of the inverter, and potentially introduce some propagation delay in a device that is subject to voltage fluctuations, it has the advantage of reducing leakage through the FETs, and thus of reducing power consumption.

As shown in FIG. 10, a programmable clock driver (or inverter) may be designed that is capable of operating in either a low power mode or in a low propagation delay mode. The mode of operation preferably is selected by the state of an enable signal. This enable signal is depicted in FIG. 10 as the FAST_H signal. According to this embodiment, the inverter is constructed with an inverting pFET gate 510 and an inverting nFET gate 520. As in conventional inverters, the gate terminal of both the pFET 510 and nFET 520 connect to the input terminal, which in the case of a clock driver, is the input clock signal. The Source of the pFET 510 couples to the power supply voltage, $V_{DD}$, while the Source of the nFET 520 couples to ground or $V_{SS}$. The Drains of both the pFET 510 and the nFET 520 connect to the output terminal, which is the output clock signal in a clock driver.

According to the principles of the present invention, the bodies of the nFET 520 and pFET 510 are coupled together using suitable technology, such as silicon-on-insulator technology. A conductive path 580 electrically couples the nFET and pFET bodies. A voltage drop transistor 530 connects at its Source terminal to the body of the pFET 510, while its Drain terminal connects to the body of the nFET 520. The voltage drop transistor 530 preferably comprises an nFET, as shown in FIG. 10. The gate of the voltage drop nFET 530 couples to the enable signal line FAST_H. Two other transistors 540, 545 are used in conjunction with the enable signal to select the mode of operation of the programmable clock driver. Transistor 540 preferably comprises a pFET, which has its gate coupled to the enable signal line, FAST_H. The Source terminal of pFET 540 connects to the power supply voltage, $V_{DD}$, while the Drain terminal connects to the body of pFET 510. Transistor 545 preferably comprises an nFET. The gate of nFET 545 couples via an inverter 550 to the enable signal line, FAST_H. The Source of nFET 545 couples to $V_{SS}$, while the Drain couples to the body of nFET 520.

The operation of the circuit of FIG. 10 will now be described, with the understanding that other circuit implementations may also be used to operate in similar fashion. When the FAST-H enable signal is high, the clock driver of FIG. 10 operates in a low propagation delay mode, generally as described in the embodiment of FIG. 6, above. When FAST_H is high, pFET 540 is non-conducting, as is nFET 545. The voltage drop nFET 530 is conductive, causing the body of pFET 510 and the body of nFET 520 to be tied together via nFET 530 and conductive path 580. The voltage drop nFET 530 produces a slight voltage differential between the body voltage of pFET 510 and nFET 520, but the threshold voltages of both nFET 520 and pFET 510 is relatively low, thus producing a clock output signal at the output terminal that has relatively little propagation delay.

If conversely, the FAST_H enable signal is driven low, the clock driver of FIG. 10 is placed in a low power mode. When FAST_H goes low, pFET 540 and nFET 545 become conductive, while voltage drop nFET 530 becomes non-conductive. As nFET 545 becomes conductive, and as nFET 530 turns off, the body of nFET 520 is pulled low by $V_{SS}$. This, in turn, increases the threshold voltage of nFET 520, which reduces the leakage through the nFET 520. The reduction in leakage current through nFET 520 results in a conservation of power. Similarly, when FAST_H is low, the pFET turns on, causing the body voltage of pFET to be pulled high by $V_{DD}$. As the body voltage of pFET is pulled high, the threshold voltage of the pFET decreases, which equates to an increase in the threshold voltage of the pFET 510 in absolute terms. This increase in threshold voltage translates to a reduction in leakage current through the pFET 510, thus conserving power.

The embodiment of FIG. 10 thus provides a clock driver or inverter that is capable of operating in two different modes based on the value of the enable signal, FAST_H. These modes are (1) a relatively slow gate that exhibits good power conservation, and (2) a relatively fast gate with minimal propagation delay. The same principle can be easily applied to more complex gates.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A clock driver, comprising:
   a clock input terminal;
   a clock output terminal;
   an nFET coupled to the clock input terminal and the clock output terminal, said nFET converting a high voltage signal on the clock input terminal to a low voltage signal on the clock output terminal;
   a pFET coupled to the clock input terminal and the clock output terminal, said pFET converting a low voltage signal on the clock input terminal to a high voltage signal on the clock output terminal; and
   wherein the nFET and pFET each include a body portion, and wherein the body portion of the nFET and the body portion of the pFET are coupled together by at least one voltage drop transistor having a gate coupled to the nFET body portion or the pFET body portion.

2. The clock driver of claim 1, wherein the nFET and the pFET are fabricated using silicon-on-insulator technology.

3. The clock driver of claim 1, wherein the coupling of the body of the nFET with the body of the pFET increases the body voltage of the nFET and decreases the body voltage of the pFET.

4. The clock driver of claim 3, wherein an increase in the body voltage of the nFET decreases the threshold voltage of the nFET, thereby reducing the propagation delay of the nFET.

5. The clock driver of claim 3, wherein a decrease in the body voltage of the pFET increases the threshold voltage level of the pFET, thus minimizing the threshold voltage differential of the pFET, and thereby reducing the propagation delay of the pFET.

6. The clock driver of claim 1, wherein the coupling of the body of the nFET to the body of the pFET minimizes the propagation delay of the clock driver resulting from power supply voltage aberrations.

7. The clock driver of claim 1, wherein the coupling of the body of the nFET to the body of the pFET can be made selectively.

8. The clock driver of claim 1, wherein the coupling of the body of the nFET to the body of the pFET reduces the threshold voltage differential of the nFET and the pFET.

9. The clock driver of claim 8, wherein the voltage drop transistor comprises an nFET.

10. The clock driver of claim 9, wherein the voltage of the pFET body is greater than the voltage of the nFET body by an amount equal to the voltage drop of the nFET voltage drop transistor.

11. The clock driver of claim 8, wherein the voltage drop transistor comprises a pFET.

12. The clock driver of claim 11, wherein the voltage of the pFET body is greater than the voltage of the nFET body by an amount equal to the voltage drop of the pFET voltage drop transistor.

13. The clock driver of claim 8, wherein the at least one voltage drop transistor comprises two nFETs connected in series.

14. The clock driver of claim 13, wherein the voltage of the pFET body is greater than the voltage of the nFET body by an amount equal to the combined voltage drop of the two nFET voltage drop transistors.

15. The clock driver of claim 8, wherein the at least one voltage drop transistor comprises two pFETs connected in series.

16. The clock driver of claim 15, wherein the voltage of the pFET body is greater than the voltage of the nFET body by an amount equal to the combined voltage drop of the two pFET voltage drop transistors.

17. The clock driver of claim 8, wherein the voltage of the pFET body is greater than the voltage of the nFET body by an amount equal to the voltage drop of the at least one voltage drop transistor.

18. The clock driver of claim 1, wherein the voltage of the nFET body is approximately the same as the voltage of the pFET body.

19. A programmable clock driver, comprising:
    a clock input terminal;
    a clock output terminal;
    an nFET coupled to the clock input terminal and the clock output terminal, said nFET converting a high voltage signal on the clock input terminal to a low voltage signal on the clock output terminal;
    a pFET coupled to the clock input terminal and the clock output terminal, said pFET converting a low voltage signal on the clock input terminal to a high voltage signal on the clock output terminal;

wherein the nFET and pFET each include a body portion, and wherein the body portion of the nFET and the body portion of the pFET are selectively coupled together based on a value of an enable signal.

20. The clock driver of claim 19, wherein the body portion of the pFET and the body portion of the nFET are coupled together via at least one voltage drop transistor that is gated by the enable signal.

21. The clock driver of claim 20, wherein the body portion of the pEET couples to a first mode switch, and the body portion of the nFET couples to a second mode switch, and wherein the first mode switch and the second mode switch are controlled by the enable signal.

22. The clock driver of claim 21, wherein the first mode switch comprises a transistor that is gated by the enable signal.

23. The clock driver of claim 21, wherein the transistor couples the pFET body to a high voltage signal when enabled by the enable signal.

24. The clock driver of claim 23, wherein the pFET operates in a low power mode when the transistor is enabled by the enable signal.

25. The clock driver of claim 21, wherein the second mode switch comprises a transistor that is gated by the enable signal.

26. The clock driver of claim 21, wherein the transistor couples the nFET body to a low voltage signal when enabled by the enable signal.

27. The clock driver of claim 21, wherein the nFET operates in a low power mode when the transistor is enabled by the enable signal.

28. The clock driver of claim 21, wherein the first mode switch comprises a pFET, gated by the enable signal, and the second mode switch comprises an nFET, gated by the enable switch.

29. The clock driver of claim 19, wherein the clock driver operates in a low power mode when the body of the nFET and the body of the pFET are not coupled together.

30. The clock driver of claim 19, wherein the clock driver operates in a low propagation mode when the body of the nFET and the body of the pFET are coupled together.

31. The clock driver of claim 19, wherein the clock driver comprises an inverter.

32. A clock driver capable of operating with a low propagation delay, comprising:

a clock input terminal;

a clock output terminal;

a first transistor coupled to the clock input terminal and the clock output terminal, said first transistor converting a high voltage signal on the clock input terminal to a low voltage signal on the clock output terminal;

a second transistor coupled to the clock input terminal and the clock output terminal, said second transistor converting a low voltage signal on the clock input terminal to a high voltage signal on the clock output terminal; and wherein the first transistor and second transistor each include a body portion, and wherein the body portion of the first transistor and the body portion of the second transistor are coupled together by at least one logic device having a gate coupled to one of the body of the first transistor or the body portion of the second transistor.

33. The clock driver of claim 32, wherein the first transistor and the second transistor are fabricated using silicon-on-insulator technology.

34. The clock driver of claim 32, wherein the coupling of the body portions of the first and second transistor reduces the threshold voltage for the first and second transistor.

35. The clock driver of claim 34, wherein the body portion of the first transistor and the body portion of the second transistor are coupled together by a conductive path, and wherein at least one logic device is included in the conductive path to separate the voltage potential of the first transistor body from the second transistor body.

36. The clock driver of claim 35, wherein the logic device comprises a field effect transistor.

37. The clock driver of claim 36, wherein the field effect transistor comprises an nFET gate.

38. The clock driver of claim 35, wherein the field effect transistor comprises a pFET gate.

39. The clock driver of claim 35, wherein multiple logic devices are included in the conductive path between the body of the first transistor and the body of the second transistor.

40. The clock driver of claim 32, wherein the coupling of the body of the first transistor with the body of the second transistor increases the body voltage of the first transistor and decreases the body voltage of the second transistor.

41. The clock driver of claim 40, wherein the first transistor comprises an nFET, and the second transistor comprises a pFET.

42. A method of minimizing propagation delay in a clock driver, comprising the acts of:

fabricating an inverter that includes a first transistor and a second transistor, and wherein each of the first transistor and second transistor have a body; and coupling the body of the first transistor to the body of the second transistor to fix the voltage of the first transistor body relative to the second transistor body via a gate of a voltage drop transistor tied to one of the bodies of the first or second transistor.

43. The method of claim 42, wherein the act of coupling the body of the first transistor to the second transistor lowers a threshold voltage of the first transistor.

44. The method of claim 43, wherein the lowering of the threshold voltage of the first transistor makes the first transistor less subject to propagation delay.

45. The method of claim 43, wherein the lowering of the threshold voltage of the second transistor makes the second transistor less subject to propagation delay.

46. The method of claim 42, wherein the act of coupling the body of the first transistor to the second transistor lowers a threshold voltage of the second transistor.

47. The method of claim 42, wherein the inverter is fabricated using silicon-on-insulator technology.

* * * * *